(12) United States Patent
Cha et al.

(10) Patent No.: US 7,989,892 B2
(45) Date of Patent: Aug. 2, 2011

(54) GATE STRUCTURE, AND SEMICONDUCTOR DEVICE HAVING A GATE STRUCTURE

(75) Inventors: Tae-Ho Cha, Gyeonggi-do (KR);
Seong-Hwee Cheong, Seoul (KR);
Jong-Min Baek, Gyeonggi-do (KR);
Jae-Hwa Park, Gyeonggi-do (KR);
Gil-Heyun Choi, Seoul (KR);
Byung-Hee Kim, Seoul (KR);
Byung-Hak Lee, Gyeonggi-do (KR);
Hee-Sook Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 152 days.

(21) Appl. No.: 12/483,761

(22) Filed: Jun. 12, 2009

(65) Prior Publication Data

US 2009/0315091 A1 Dec. 24, 2009

(30) Foreign Application Priority Data

Jun. 23, 2008 (KR) .................. 10-2008-0058959

(51) Int. Cl.
*H01L 21/44* (2006.01)

(52) U.S. Cl. ................ 257/347; 257/E29.345; 438/583
(58) Field of Classification Search ................ 257/347, 257/E29.345; 438/581, 583
See application file for complete search history.

(56) References Cited

U.S. PATENT DOCUMENTS

| 5,796,151 | A | 8/1998 | Hsu et al. | |
|---|---|---|---|---|
| 2004/0232467 | A1* | 11/2004 | Otsuki et al. | 257/303 |
| 2005/0017305 | A1* | 1/2005 | Koyama et al. | 257/351 |
| 2008/0135936 | A1* | 6/2008 | Nakajima | 257/347 |

FOREIGN PATENT DOCUMENTS

| JP | 2006-093182 | 4/2006 |
|---|---|---|
| KR | 1020000028923 A | 5/2000 |
| KR | 1020050008050 A | 1/2005 |
| KR | 1020060100856 A | 9/2006 |

* cited by examiner

*Primary Examiner* — Thomas L Dickey

(74) *Attorney, Agent, or Firm* — Myers Bigel Sibley & Sajovec, P.A.

(57) ABSTRACT

A gate structure can include a polysilicon layer, a metal layer on the polysilicon layer, a metal silicide nitride layer on the metal layer and a silicon nitride mask on the metal silicide nitride layer.

9 Claims, 4 Drawing Sheets

⊗—► FIRST DIRECTION
SECOND DIRECTION

GATE STRUCTURE, AND SEMICONDUCTOR DEVICE HAVING A GATE STRUCTURE

CROSS-REFERENCE TO RELATED APPLICATIONS

This application claims priority under 35 U.S.C. §119 to Korean Patent Application No. 2008-58959, filed on Jun. 23, 2008 in the Korean Intellectual Property Office (KIPO), the contents of which are herein incorporated by reference in their entirety.

FIELD OF THE INVENTION

Example embodiments relate to a gate structure, a method of forming a gate structure and a semiconductor device having a gate structure. More particularly, example embodiments relate to a gate structure having a low sheet resistance, a method of forming a gate structure having a low sheet resistance and a semiconductor device having a gate structure having a low sheet resistance.

BACKGROUND

A polysilicon layer doped with impurities has been used as a gate electrode. However, as a semiconductor device has a high degree of integration, the semiconductor device using the polysilicon layer doped with impurities as a gate electrode has a high resistance due to a high specific resistance of the polysilicon layer. Accordingly, the polysilicon layer may not be suitable for a gate electrode. A polycide gate electrode of which a specific resistance is lower than that of a polysilicon layer has been developed. The polycide gate electrode may have a structure in which a refractory metal silicide layer such as a titanium silicide layer or a tungsten silicide layer is formed on a polysilicon layer doped with impurities. However, the polycide gate electrode may not satisfy a resistance level suitable for a gate electrode called for in high integration semiconductor devices.

Recently, a polymetal gate electrode having a low specific resistance is used as a gate electrode. The polymetal gate electrode has a multilayer structure in which a refractory metal layer is formed on a polysilicon layer doped with impurities. The refractory metal layer may include tungsten. However, when the tungsten layer on the polysilicon layer is patterned, the resistance of the tungsten layer is sometimes increased.

FIG. 1 is a cross-sectional view illustrating a conventional method of forming a gate structure. Referring to FIG. 1, a gate insulation layer, a polysilicon layer, a barrier metal layer and a tungsten layer are sequentially formed on a substrate 10. The gate insulation layer, the polysilicon layer, the barrier metal layer and the tungsten layer are patterned by using a silicon nitride layer mask 35 as an etching mask. Accordingly, a gate structure 40 including a gate insulation layer pattern 15, a polysilicon layer pattern 20, a barrier metal layer pattern 25, a tungsten layer pattern 30 and the silicon nitride layer mask 35 are formed on the substrate 10.

When a silicon nitride layer used as the silicon nitride layer mask 35 is formed on the tungsten layer, nitrogen atoms may penetrate into the tungsten layer, so that the resistance of the tungsten layer may be increased. For example, ammonia ($NH_3$) gas can be provided into a process chamber to control the generation of a remaining oxidation source and oxidation of the tungsten layer before forming the silicon nitride layer on the tungsten layer. In this case, nitrogen atoms included in the ammonia gas may penetrate into the tungsten layer to increase a sheet resistance of the tungsten layer. When the sheet resistance of the tungsten layer is increased, a gate structure formed by a following process may have increased resistance. Also, nitrogen atoms included in the silicon nitride mask 35 may diffuse into the tungsten layer to increase the sheet resistance of the tungsten layer.

SUMMARY

According to some example embodiments, there is provided a gate structure. The gate structure includes a polysilicon layer, a metal layer on the polysilicon layer, a metal silicide nitride layer on the metal layer and a silicon nitride mask on the metal silicide nitride layer.

In an example embodiment, the metal silicide nitride layer may include a metal including tungsten (W), tantalum (Ta), titanium (Ti), cobalt (Co), molybdenum (Mo), hafnium (Hf) or nickel (Ni), etc. These may be used alone or in a combination thereof.

In an example embodiment, an upper portion of the metal silicide nitride layer may have a nitrogen concentration substantially larger than that of a lower portion of the metal silicide nitride layer.

In an example embodiment, the metal silicide nitride layer may have a thickness of about 5 Å to about 100 Å.

In an example embodiment, the gate structure may further comprise a metal silicide layer between the metal layer and the metal silicide nitride layer. The metal layer may include tungsten, the metal silicide layer includes a tungsten silicide layer and the metal silicide nitride layer includes a tungsten silicon nitride layer.

In an example embodiment, the metal silicide nitride layer may have an amorphous phase.

According to some example embodiments, there is a method of forming a gate structure. A polysilicon is formed on a substrate. A metal layer is formed on the polysilicon layer. A metal silicide nitride layer is formed on the metal layer. A silicon nitride mask is formed on the metal silicide nitride layer.

In an example embodiment, the metal silicide nitride layer may be formed using a metal including tungsten (W), tantalum (Ta), titanium (Ti), cobalt (Co), molybdenum (Mo), hafnium (Hf) or nickel (Ni), etc. These may be used alone or in a combination thereof.

In an example embodiment, when the silicon nitride mask is formed on the metal silicide nitride layer, nitrogen atoms may be diffused into the metal silicide nitride layer.

In an example embodiment, a metal silicide layer may be further formed on the metal layer and nitrogen atoms may be diffused into the metal silicide layer to form the metal silicide nitride layer. When the nitrogen atoms are diffused into the metal silicide layer, nitrogen atoms may be diffused into only an upper portion of the metal silicide layer.

In an example embodiment, the metal silicide nitride layer has an amorphous phase.

According to some example embodiments, there is provided a semiconductor device. A gate insulation layer is formed on the substrate. A gate structure is formed on the gate insulation layer. The gate structure includes a polysilicon layer, a metal layer on the polysilicon layer, a metal silicide nitride layer on the metal layer and a silicon nitride mask on the metal silicide nitride layer. Impurity regions are formed on an upper portion of the substrate adjacent to the gate structure. A capacitor is formed to be electrically connected to the impurity regions.

In an example embodiment, the metal silicide nitride layer may include a metal including tungsten (W), tantalum (Ta), titanium (Ti), cobalt (Co), molybdenum (Mo), hafnium (Hf) or nickel (Ni), etc. These may be used alone or in a combination thereof.

In an example embodiment, the semiconductor device may further include metal silicide layer between the metal layer and the metal silicide nitride layer.

According to some example embodiments, when a silicon nitride layer mask is formed on a metal layer, an increase of a sheet resistance of the metal layer may be prevented. A nitrification prevention layer is formed between the metal layer and the silicon nitride mask. The nitrification prevention layer prevents nitrogen atoms from diffusing into the metal layer. Accordingly, the increase of the sheet resistance of the metal layer may be prevented, so that a reliability of a semiconductor device may be improved.

BRIEF DESCRIPTION OF THE DRAWINGS

Example embodiments will be more clearly understood from the following detailed description taken in conjunction with the accompanying drawings.

FIG. 1 is a cross-sectional view illustrating a conventional method of forming a gate structure;

FIG. 2 is a cross-sectional view illustrating a gate structure in accordance with some example embodiments of the present invention;

FIGS. 3 to 6 are cross-sectional views illustrating a method of forming a gate structure in accordance with some example embodiments of the present invention; and FIG. 7 is a cross-sectional view illustrating a semiconductor device in accordance with some example embodiments of the present invention.

DETAILED DESCRIPTION OF THE EMBODIMENTS

Figure 1:
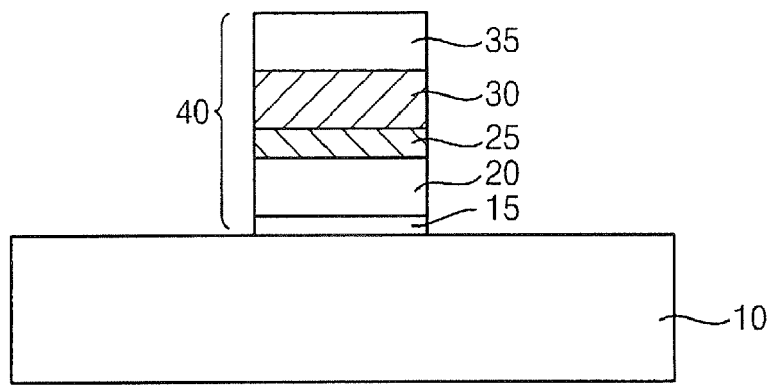
FIGS. 1 to 7 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
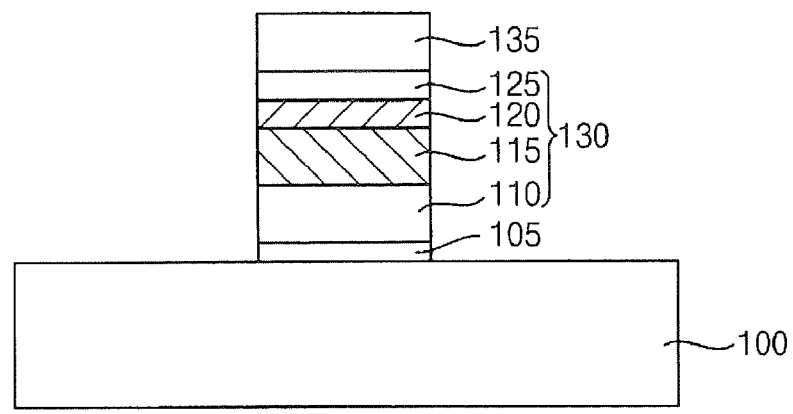

FIG. 2 is a cross-sectional view illustrating a gate structure in accordance with some example embodiments of the present invention.

Referring to FIG. 2, a gate structure is formed on a substrate 100. A gate insulation layer 105 is formed on a substrate 100. The gate structure includes a polymetal gate electrode structure 130 on the gate insulation layer 105 and a silicon nitride layer mask 135 on the polymetal gate electrode structure 130.

The substrate may include a silicon substrate, a germanium substrate, a silicon-germanium substrate, a silicon-on-insulator (SOI) substrate, a germanium-on-insulator (GOI) substrate, etc. A p-type well or an n-type well may be formed on an upper portion of the substrate 10.

The gate insulation layer 105 may include oxide, for example, thermal oxide. Alternatively, the gate insulation layer 105 may include a dielectric layer having a high dielectric constant such as hafnium (Hf), zirconium (Zr), tantalum (Ta), titanium (Ti), lanthanum (La), etc. Alternatively, the gate insulation layer 105 may include a silicon oxide, silicon nitride, etc. The gate insulation layer 105 electrically insulates the polymetal gate electrode structure 130 from the substrate 100.

The polymetal gate electrode structure 130 includes a polysilicon layer 110 on the gate insulation layer 105, a barrier metal layer 115 on the polysilicon layer 110, a metal layer 120 on the barrier metal layer 115 and a nitrification prevention layer 125 on the metal layer 120.

The polysilicon layer 110 may be doped with impurities such as boron (B), phosphorus (P), arsenic (As), etc.

An ohmic layer, which is not illustrated in FIG. 2, may be further formed between the barrier metal layer 115 and the polysilicon layer 110. The ohmic layer may include metal having a high melting point and a low resistance. For example, the ohmic layer may include titanium (Ti), tantalum (Ta), tungsten (W), molybdenum (Mo), etc. These may be used alone or in a combination thereof. The ohmic layer may prevent an interfacial resistance between the barrier metal layer 115 and the polysilicon layer 110 from being increased.

As used herein the term "ohmic" refers to layers where an impedance associated therewith is substantially given by the relationship of Impedance=V/I, where V is a voltage across the layer and I is the current, at substantially all expected operating frequencies (i.e., the impedance associated with the ohmic layer is substantially the same at all operating frequencies). For example, in some embodiments according to the invention, an ohmic layer can have a specific resistivity of less than about $10e-03$ ohm-cm$^2$ and, in some embodiments less than about $10e-04$ ohm-cm$^2$. Thus, a layer that is rectifying or that has a high specific resistivity, for example, a specific resistivity of greater than about $10e-03$ ohm-cm$^2$, is not an ohmic layer as that term is used herein.

The barrier metal layer 115 may include a titanium layer or/and a titanium nitride layer. The barrier metal layer 115 may prevent the polysilicon layer 110 and the metal layer 120 from being reacted with each other.

The nitrification prevention layer 125 may include metal silicide and/or metal silicide nitride. The nitrification prevention layer 125 may have an amorphous phase. The nitrification prevention layer 125 may include tungsten (W), tantalum (Ta), titanium (Ti), cobalt (Co), nickel (Ni), molybdenum (Mo), niobium (Nb), vanadium (V), hafnium (Hf), etc. Also, the nitrification prevention layer 125 may include metal of which reactivity toward nitrogen gas or nitrogen atoms is substantially the same as or substantially larger than that of metal included in the metal layer 120.

It will be understood that the term "nitrification prevention layer" includes layers that can substantially reduce nitrification to the point where the aspects described herein can be provided even if nitrification is not completely prevented.

In an example embodiment, the nitrification prevention layer 125 may be a single layer of a metal silicide nitride layer. An upper portion of the nitrification prevention layer 125 may have a nitrogen concentration substantially larger than that of a lower portion of the nitrification prevention layer 125. Alternatively, the nitrification prevention layer 125 has a structure in which a metal silicon nitride layer is formed on a metal silicide layer. In this case, an interface between the metal silicon nitride layer and the metal silicide layer may not exist. In an example embodiment, only an upper portion of the nitrification prevention layer 125 including a metal silicide layer may be nitrified.

The nitrification prevention layer 125 may prevent nitrogen atoms being diffused or penetrated into the metal layer 120. When the silicon nitride layer mask 135 is formed on the metal layer, nitrogen atoms may be diffused into the metal layer 120. In this case, a sheet resistance of the metal layer 120 may be increased. Accordingly, when the silicon nitride layer mask 135 is formed after forming the nitrification prevention layer 125 on the metal layer 120, a sheet resistance of the metal layer 120 may not be increased because the nitrification prevention layer 125 prevents nitrogen atoms being diffused or penetrated into the metal layer 120. The nitrification prevention layer 125 may be used as an electrode together with the metal layer 120 because the nitrification prevention layer 125 includes conductive material.

When the nitrification prevention layer 125 has a large thickness, the nitrification prevention layer 125 may prevent nitrogen atoms from being diffused into the metal layer 120 well. However, when the nitrification prevention layer 125 has a large thickness, the polymetal gate structure 130 has a large thickness. Thus, in an example embodiment, the nitrification prevention layer 125 may have a thickness of about 5 Å to about 100 Å, more preferably, about 10 Å to 60 Å.

After forming a nitrification prevention layer on a tungsten layer and forming a titanium layer having a thickness of about 30 Å on a tungsten layer, respectively, an annealing process using ammonia (NH$_3$) gas is performed to the tungsten layers. Then, sheet resistances of the tungsten layers were measured, respectively.

Example 1

A tungsten layer was formed on an oxide layer. A tungsten silicide layer having a thickness of about 30 Å was formed on the tungsten layer as a nitrification prevention layer. The tungsten silicide layer was formed using a physical vapor deposition (PVD) process. After forming the tungsten silicide layer, an annealing process using NH3 gas was performed for about 3 minutes. Nitrogen atoms might be diffused into the tungsten silicide layer to convert the tungsten silicide layer into a tungsten silicide nitride layer. A sheet resistance was measured in three cases, 1) between forming the tungsten layer and forming the tungsten silicide layer, 2) between forming the tungsten silicide layer and performing the annealing process using the NH3 gas and 3) after performing the annealing process using the NH3 gas.

Comparative Example 1

An embodiment in which a titanium layer having a thickness of about 100 Å is used as a nitrification prevention layer is disclosed in Japanese Laid-Open Publication No. 2006-93182. However, when the nitrification prevention layer has a thickness of about 100 Å, a polymetal gate structure having the nitrification prevention layer can have an unnecessarily large thickness. In Comparative Example 1, a titanium layer having a thickness of about 30 Å was used as a nitrification prevention layer.

A tungsten layer was formed on an oxide layer. A titanium layer having a thickness of about 30 Å was formed on the tungsten layer as a nitrification prevention layer. After forming the titanium layer, an annealing process using NH3 gas was performed for about 3 minutes. A sheet resistance was measured in three cases, 1) between forming the tungsten layer and forming the titanium layer, 2) between forming the titanium layer and performing the annealing process using the NH3 gas and 3) after performing the annealing process using the NH3 gas.

Sheet resistances of tungsten layer measured in Example 1 and Comparative Example 1 were represented in the following Table 1.

TABLE 1

|  | 1) (ohm/sq) | 2) (ohm/sq) | 3) (ohm/sq) |
| --- | --- | --- | --- |
| Example 1 | 3.05 | 3.07 | 2.29 |
| Comparative Example 1 | 3.05 | 3.03 | 3.84 |

A sheet resistance of a tungsten layer measured before forming a nitrification prevention layer in Example 1 was the same as that in Comparative Example 1. A sheet resistance of a tungsten layer measured between forming the titanium layer and performing the annealing process using the NH3 gas in Example 1 was little bit larger than that in Comparative Example 1. However, the difference between the sheet resistances was minute. In Example 1, a sheet resistance of the tungsten layer after performing the annealing process using the NH3 gas was reduced by about 5% compared to that measured before performing the annealing process using the NH3 gas. Meanwhile, in Comparative Example 1, a sheet resistance of the tungsten layer after performing the annealing process using the NH3 gas was increased by about 27% compared to that measured before performing the annealing process using the NH3 gas. That is, when the titanium layer having a thickness of about 30 Å was used as the nitrification prevention layer, the sheet resistance was increased after performing the annealing process. The titanium layer having a thickness of about 30 Å may not prevent nitrogen atoms from being diffused into the tungsten layer. Meanwhile, the tungsten silicide layer having a thickness of about 30 Å may prevent nitrogen atoms from being diffused into the tungsten layer. Thus, when the tungsten silicide layer is used as the nitrification prevention layer, a sheet resistance of the tungsten layer is reduced after performing the annealing process using the NH3 gas.

FIGS. 3 to 6 are cross-sectional views illustrating a method of forming a gate structure in accordance with some example embodiments of the present invention.

Figure 3:
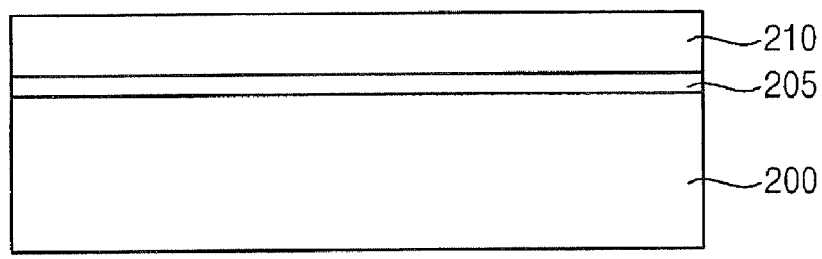

Referring to FIG. 3, a gate insulation layer 205 and a polysilicon layer 210 are sequentially formed on a substrate 200.

The gate insulation layer 205 may be formed using oxide such as silicon oxide or oxynitride such as silicon nitride. The gate insulation layer 205 may be formed by a chemical vapor deposition (CVD) process, an atomic layer deposition (ALD) process or a PVD process such as a sputtering process. Alternatively, the gate insulation layer 205 may be formed by a thermal oxidation process.

An undoped polysilicon layer may be formed on the gate insulation layer 205 by a CVD process, an ALD process or a PVD process. P-type impurities such as boron (B), indium (In) or gallium (Ga) or n-type impurities such as phosphorus (P), arsenic (As) or antimony (Sb) may be implanted into the undoped polysilicon layer to form the polysilicon layer 210.

Figure 4:
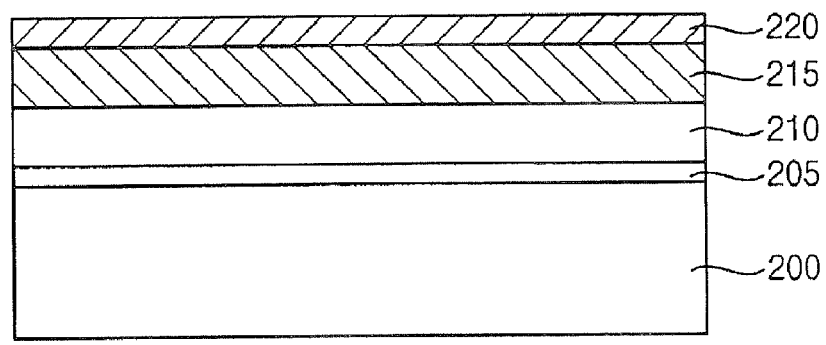

Referring to FIG. 4, a barrier metal layer 215 and a metal layer 220 are sequentially formed on the polysilicon layer 210.

The metal barrier layer 215 may include a titanium (Ti) layer and/or a titanium nitride (TiN) layer. The metal barrier layer 215 may be formed by a CVD process, an ALD process or a PVD process. The metal barrier layer 215 may prevent the polysilicon layer 210 and the metal layer 220 from being reacted with each other.

An ohmic layer, which is not illustrated, may be further formed between the barrier metal layer 215 and the polysilicon layer 210. The ohmic layer may include metal having a high melting point and a low resistance. For example, the ohmic layer may include titanium (Ti), tantalum (Ta), tungsten (W), molybdenum (Mo), etc. These may be used alone or in a combination thereof. The ohmic layer may prevent an interfacial resistance between the barrier metal layer 215 and the polysilicon layer 210 from being increased.

The metal layer 220 may include polysilicon doped with impurities, a silicon germanium layer or metal such as tungsten (W), copper (Cu), titanium (Ti), tantalum (Ta), aluminum (Al), etc. The metal layer 220 may further include tungsten silicide ($WSi_x$), cobalt silicide ($CoSi_x$), titanium silicide ($TiSi_x$), nickel silicide ($NiSi_x$), etc. In an example embodiment, the metal layer 220 is formed using tungsten (W). The metal layer 220 may be formed by a CVD process, an ALD process or a PVD process.

Figure 5:
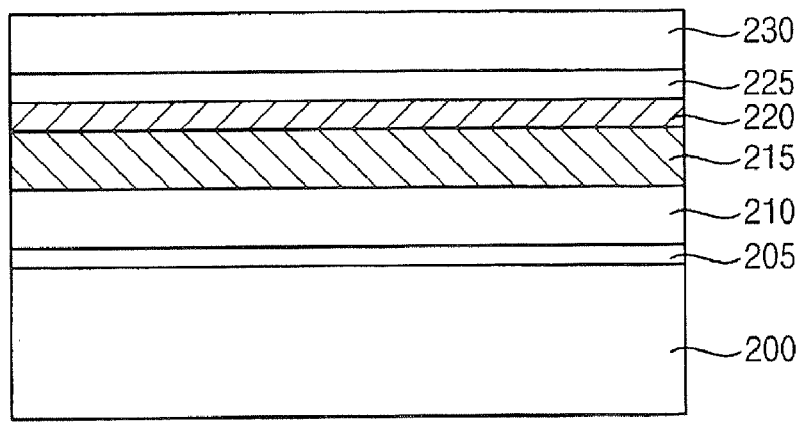

Referring to FIG. 5, a nitrification prevention layer 225 and a silicon nitride layer 230 are sequentially formed on a metal layer 220. The nitrification prevention layer 225 may include metal silicide and/or metal silicide nitride. The nitrification prevention layer 225 may have an amorphous phase. The nitrification prevention layer 225 may include tungsten (W), tantalum (Ta), titanium (Ti), cobalt (Co), nickel (Ni), molybdenum (Mo), niobium (Nb), vanadium (V), hafnium (Hf), etc. Also, the nitrification prevention layer 225 may include metal of which reactivity toward nitrogen gas or nitrogen atoms is larger than that of metal included in the metal layer 220. In an example embodiment, the nitrification prevention layer 225 may be formed using an amorphous metal layer including titanium or tantalum.

In an example embodiment, the nitrification prevention layer 225 may include metal silicide. The nitrification prevention layer 225 may be formed by a plasma-enhanced chemical vapor deposition (PECVD) process, a CVD process, an ALD process or a PVD process.

When the silicon nitride layer 230 is formed on the nitrification prevention layer 225, nitrogen atoms may be diffused into the nitrification prevention layer 225. For example, a gate structure is annealed before forming the silicon nitride layer 230 on the nitrification prevention layer 225 during providing ammonia ($NH_3$) gas into a process chamber. Nitrogen atoms in the $NH_3$ gas may be diffused into the nitrification prevention layer 225 when the annealing process is performed. Alternatively, even when the silicon nitride layer 230 is formed on the nitrification prevention layer 225 without providing the $NH_3$ gas, nitrogen atoms in the silicon nitride layer 230 may be diffused into the nitrification prevention layer 225.

Nitrogen atoms and the metal silicide included in the nitrification prevention layer 225 may be reacted with each other due to the diffusion of the nitrogen atoms to form a metal silicide nitride layer. The nitrification prevention layer 225 may be a single layer of a metal silicide nitride layer. An upper portion of the nitrification prevention layer 225 may have a nitrogen concentration substantially larger than that of a lower portion of the nitrification prevention layer 225. Alternatively, the nitrification prevention layer 225 has a structure in which a metal silicon nitride layer is formed on a metal silicide layer. In this case, an interface between the metal silicon nitride layer and the metal silicide layer may not exist. That is, only an upper portion of the nitrification prevention layer 225 including a metal silicide layer is nitrified.

In an example embodiment, the nitrification prevention layer 225 is formed by forming an amorphous metal silicide nitride layer on the metal layer 220. The amorphous metal silicide nitride layer may be formed by a PECVD process, a CVD process, an ALD process or a PVD process. In an example embodiment, the nitrification prevention layer 225 may include metal of which reactivity toward nitrogen gas or nitrogen atoms is substantially the same as or substantially larger than that of metal included in the metal layer 220. In an example embodiment, the nitrification prevention layer 225 may be formed using an amorphous metal layer including titanium or tantalum.

The nitrification prevention layer 225 may prevent nitrogen atoms being diffused or penetrated into the metal layer 220. When a silicon nitride layer mask (see FIG. 6, 270) is formed on the metal layer, nitrogen atoms may be diffused into the metal layer 220. In this case, a sheet resistance of the metal layer 220 may be increased. Accordingly, when the silicon nitride layer mask 270 is formed after forming the nitrification prevention layer 225 on the metal layer 220, a sheet resistance of the metal layer 220 may not be increased because the nitrification prevention layer 225 prevents nitrogen atoms being diffused or penetrated into the metal layer 220. The nitrification prevention layer 225 may be used as an electrode together with the metal layer 220 because the nitrification prevention layer 225 includes conductive material.

When the nitrification prevention layer 225 has a large thickness, the nitrification prevention layer 225 may prevent nitrogen atoms from being diffused into the metal layer 220 well. However, when the nitrification prevention layer 225 has a large thickness, a polymetal gate structure (see FIG. 6, 235) has a large thickness. Thus, in an example embodiment, the nitrification prevention layer 225 may have a thickness of about 5 Å to about 100 Å, more preferably, about 10 Å to 60 Å.

Figure 6:
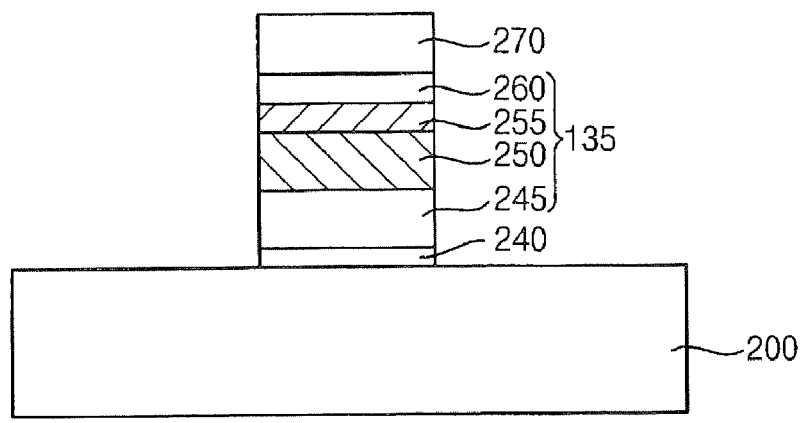

Referring to FIG. 6, the polymetal gate structure 235 is formed on the substrate 200. For example, a photoresist pattern (not shown) is formed on the silicon nitride layer 230. The silicon nitride layer 230 is patterned to form the silicon nitride layer mask 270 using the photoresist pattern in a photolithography process. The nitrification prevention layer 225, the metal layer 220, and the barrier metal layer 215, the polysilicon layer 210 and the gate insulation layer 205 are sequentially patterned using the silicon nitride layer mask 270 as an etching mask to form the gate insulation layer pattern 240 and the polymetal gate structure including the nitrification prevention layer pattern 260, the metal layer pattern 255, and the barrier metal layer pattern 250 and the polysilicon layer pattern 245. Although not illustrated, a spacer may be further formed on sidewalls of the nitrification prevention layer pattern 260, the metal layer pattern 255, and the barrier metal layer pattern 250, the polysilicon layer pattern 245 and the gate insulation layer pattern 240 using silicon nitride.

Figure 7:
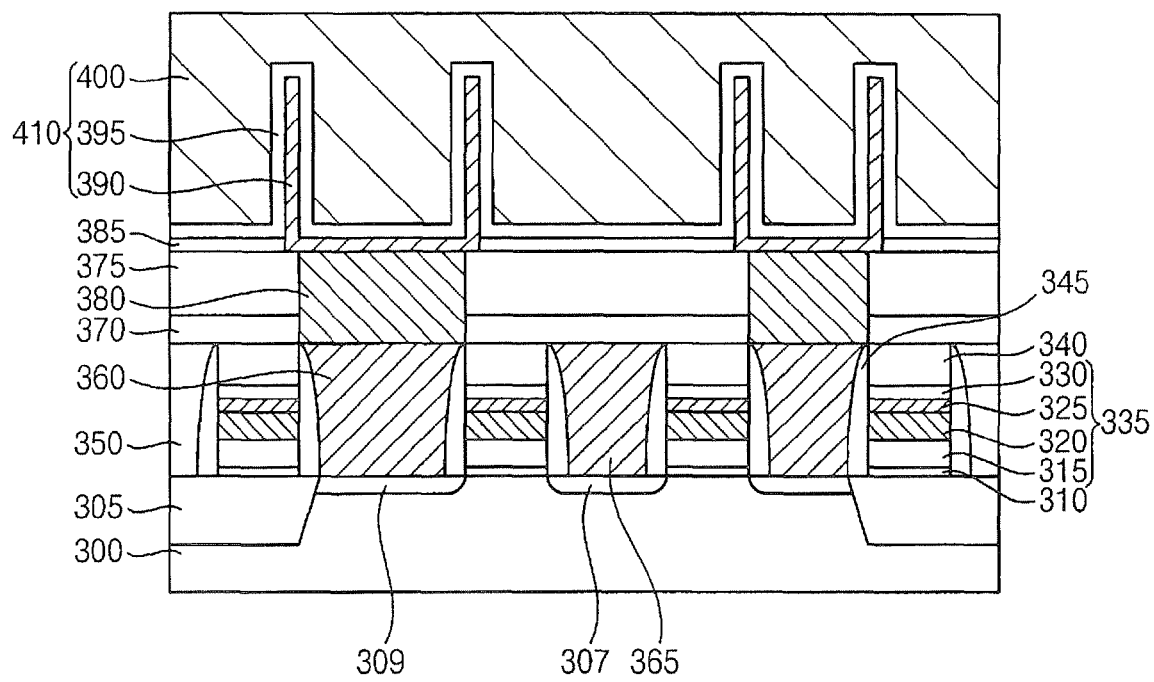

FIG. 7 is a cross-sectional view illustrating a semiconductor device in accordance with some example embodiments of the present invention.

A semiconductor device includes a gate structure 335, first and second impurity regions 307 and 309 on a surface of the substrate 300 adjacent to the gate structure 335 and capacitor 410.

An isolation layer 305 is formed on an upper portion of the substrate 300 to define an active region. The isolation layer 305 may be formed using spin-on glass (SOG) having a high fluidity, undoped silicate glass (USG), a high-density plasma chemical vapor deposition (HDP-CVD) oxide, etc. Alternatively the isolation layer 305 may be formed by a thermal oxidation process.

A gate insulation layer pattern 310 is formed on a substrate. The gate structure 335 is formed on the gate insulation layer pattern 310. The gate structure 335 includes a polysilicon layer pattern 315, a barrier metal layer pattern 320, a metal layer pattern 325 and a nitrification prevention layer pattern 330. The gate structure 335 may extend in a second direction and a plurality of gate structures 335 is spaced apart from each other along a first direction substantially perpendicular to the second direction. A silicon nitride layer mask 345 is formed on the gate structure 340. A spacer 345 is formed on sidewalls of the gate insulation layer pattern 310, the gate structure 340 and the silicon nitride layer mask 345. Because the gate structure has a structure substantially the same as the polymetal gate structure in FIG. 6, detailed descriptions will be omitted.

The first and second impurity regions 307 and 309 include p-type impurities or n-type impurities. The first and second impurity regions 307 and 309 may be used as a source region or a drain region.

A first insulation interlayer 350 is formed between the plurality of gate structures 335. The first insulation interlayer 350 may include oxide such as borophosphosilicate glass (BPSG), USG, SOG, etc. The first insulation interlayer 350 insulates the plurality of gate structures 335 with each other.

A first contact plug 365 is formed through the first insulation interlayer 350 to electrically contact to the first impurity region 307. A second contact plug 360 is formed through the first insulation interlayer 350 to electrically contact to the second impurity region 309. The first and second contact plugs 365 and 360 may include metal or polysilicon doped with impurities.

Although not illustrated, a bit line is formed on the first insulating interlayer 350 to contact to the first contact plug 365. The bit line may be plural and the plurality of bit lines may be formed along the first direction, and be spaced apart from each other along the second direction. The bit line may include metal, metal nitride, polysilicon doped with impurities.

A second insulation interlayer 370 is formed between the plurality of bit lines. The second insulation interlayer 370 may include oxide such as BPSG, USC, SOG, etc. The second insulation interlayer 370 insulates the plurality of bit lines from each other.

A third insulating interlayer 375 is formed on the bit line and the second insulating interlayer 370. The third insulating interlayer 375 may include BPSG, USG, SOG, etc.

A third contact plug 380 is formed on the second contact plug 360 through the second and third insulating interlayer 370 and 375. The third contact plug 380 may include metal, metal nitride, polysilicon doped with impurities. An etch-stop layer 385 is formed on the third insulating interlayer 375.

A capacitor 410 is formed on the third insulating interlayer 375 to electrically contact to the third contact 380. The capacitor includes a lower electrode, a dielectric layer 395 and an upper electrode 400. The lower electrode and the upper electrode 390 and 400 may include metal, metal nitride, polysilicon doped with impurities. The dielectric layer 395 may include silicon nitride or a dielectric material having a dielectric constant substantially higher than that of the silicon nitride. For example, the dielectric layer 395 may include tantalum oxide, hafnium oxide, aluminum oxide, zirconium oxide, etc. These may be used alone or in a combination thereof.

The gate structure 335 may have a lower sheet resistance and good thermal stability. Accordingly, a semiconductor device having the gate structure may perform with high operation speed and have high reliability.

According to the present invention, the gate structure has a structure in which a nitrification prevention layer is formed between a metal layer and a silicon nitride layer. The nitrification prevention layer prevents nitrogen atoms from being diffused into the metal layer, so that an increase of a sheet resistance of the metal layer is prevented.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed:

1. A gate structure comprising:
   a polysilicon layer;
   a metal layer on the polysilicon layer;
   a metal silicide nitride layer on the metal layer;
   a silicon nitride mask on the metal silicide nitride layer; and
   a metal silicide layer between the metal layer and the metal silicide nitride layer.

2. The gate structure of claim 1, wherein the metal silicide nitride layer includes a metal including tungsten (W), tantalum (Ta), titanium (Ti), cobalt (Co), molybdenum (Mo), hafnium (Hf) and/or nickel (Ni).

3. The gate structure of claim 1, wherein the metal silicide nitride layer comprises a thickness of about 5 Å to about 100 Å.

4. The gate structure of claim 1, wherein the metal layer includes tungsten and the metal silicide nitride layer includes a tungsten silicon nitride layer.

5. The gate structure of claim 1, wherein the metal layer includes tungsten, the metal silicide layer includes a tungsten silicide layer and the metal silicide nitride layer includes a tungsten silicon nitride layer.

6. The gate structure of claim 1, wherein the metal silicide nitride layer includes an amorphous phase.

7. A gate structure comprising:
   a polysilicon layer;
   a metal layer on the polysilicon layer;
   a metal silicide nitride layer on the metal layer; and
   a silicon nitride mask on the metal silicide nitride layer,
   wherein an upper portion of the metal silicide nitride layer immediately adjacent to the silicon nitride mask comprises a nitrogen concentration substantially greater than a nitrogen concentration in a lower portion of the metal silicide nitride layer.

8. A semiconductor device comprising:
   a gate insulation layer on a substrate;
   a gate structure including a polysilicon layer, a metal layer on the polysilicon layer, a metal silicide nitride layer on the metal layer and a silicon nitride mask on the metal silicide nitride layer;
   impurity regions on an upper portion of the substrate adjacent to the gate structure;
   a capacitor electrically connected to the impurity regions; and
   a metal silicide layer between the metal layer and the metal silicide nitride layer.

9. The semiconductor device of claim 8, wherein the metal silicide nitride layer includes a metal comprising tungsten (W), tantalum (Ta), titanium (Ti), cobalt (Co), molybdenum (Mo), hafnium (Hf) and/or nickel (Ni).

* * * * *